United States Patent
Hsiao et al.

(10) Patent No.: US 9,985,122 B2
(45) Date of Patent: May 29, 2018

(54) SEMICONDUCTOR STRUCTURES

(71) Applicant: Taiwan Semiconductor Manufacturing Company Ltd., Hsinchu (TW)

(72) Inventors: Ru-Shang Hsiao, Jhubei (TW); Chi-Cherng Jeng, Tainan (TW); Chih-Mu Huang, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days. days.

(21) Appl. No.: 14/949,741

(22) Filed: Nov. 23, 2015

(65) Prior Publication Data

US 2016/0343822 A1 Nov. 24, 2016

Related U.S. Application Data

(60) Provisional application No. 62/163,541, filed on May 19, 2015.

(51) Int. Cl.
*H01L 29/51* (2006.01)
*H01L 29/735* (2006.01)
(Continued)

(52) U.S. Cl.
CPC .......... *H01L 29/78* (2013.01); *H01L 23/291* (2013.01); *H01L 23/3192* (2013.01); *H01L 29/735* (2013.01)

(58) Field of Classification Search
CPC ... H01L 29/511; H01L 29/0649; H01L 29/78; H01L 29/51; H01L 29/772; H01L 29/66477; H01L 29/66768; H01L 29/66863; H01L 29/735; H01L 29/7378; H01L 27/1122; H01L 41/0533
See application file for complete search history.

(56) References Cited

U.S. PATENT DOCUMENTS 6,123,192 A * 9/2000 Rufo, Jr. ................ G11B 23/00
206/308.1
2003/0170993 A1* 9/2003 Nagahara .......... H01L 21/02063
438/694

(Continued)

OTHER PUBLICATIONS

Legtenberg. Anisotropic Reactive Ion Etching of Silicon Using SF6/O2/CHF3 Gas Mixture. J. Electrochem. Soc. vol. 142, No. 6, Jun. 1995, pp. 2020-2028.*

(Continued)

*Primary Examiner* — Galina Yushina
(74) *Attorney, Agent, or Firm* — WPAT, P.C., Intellectual Property Attorneys; Anthony King

(57) ABSTRACT

A semiconductor structure comprising a substrate, a pre-metal-interconnect dielectric (PMID) layer and a composite layer is disclosed. The PMID layer is above the substrate. The composite layer is between the substrate and the PMID layer. The composite layer comprises a first sublayer and a second sublayer. The first sublayer and the second sublayer are stacked. The bandgap of the second sublayer is larger than the bandgap of the first sublayer. The etch rate of an etchant with respect to the first sublayer is lower than the etch rate of the etchant with respect to the substrate and the PMID layer. Other semiconductor structures are also disclosed.

20 Claims, 5 Drawing Sheets

(51) Int. Cl.
H01L 29/78 (2006.01)
H01L 23/29 (2006.01)
H01L 23/31 (2006.01)

(56) References Cited

U.S. PATENT DOCUMENTS

| | | | | |
|---|---|---|---|---|
| 2007/0023822 A1* | 2/2007 | Sung | H01L 29/42324 | 257/316 |
| 2009/0152734 A1* | 6/2009 | Smayling | H01L 29/42376 | 257/774 |
| 2012/0098070 A1* | 4/2012 | Wang | H01L 21/76834 | 257/368 |
| 2014/0151763 A1* | 6/2014 | Hung | H01L 23/485 | 257/288 |
| 2015/0087132 A1* | 3/2015 | Zhang | H01L 21/31116 | 438/421 |
| 2015/0187574 A1* | 7/2015 | Le | H01L 21/02631 | 438/104 |
| 2015/0349143 A1* | 12/2015 | Inoue | H01L 29/513 | 257/324 |

OTHER PUBLICATIONS

Ray. Rapid plasma etching of silicon, silicon dioxide and silicon nitride using microwave discharges. Semicond. Sci. Technol. 8 (1993), pp. 599-604.*

Jin et al. Electronic structure of ultrathin Si oxynitrides, Abstract, Surface and Interface Analysis, 2006, 38, p. 1564.*

Huang et al. Hafnium-based High-k Gate Dielectrics. Advances in Solid-State Circuits Technologies, 2010, pp. 333-349.*

* cited by examiner

SEMICONDUCTOR STRUCTURES

PRIORITY CLAIM AND CROSS-REFERENCE

This application claims the benefit of provisional application Ser. 62/163,541 filed on 19 May 2015, entitled "SEMICONDUCTOR STRUCTURES," the disclosure of which is hereby incorporated by reference in its entirety.

FIELD

This disclosure relates to semiconductor structures.

BACKGROUND

The semiconductor integrated circuit (IC) industry has experienced rapid growth. In the course of IC evolution, functional density (i.e., the number of interconnected devices per chip area) has generally increased while geometric size (i.e., the smallest component (or line) that can be created using a fabrication process) has decreased. This down-scaling process generally provides benefits by increasing production efficiency and lowering associated costs. Such down-scaling has also increased the complexity of processing and manufacturing ICs and, in order to realize these advances, corresponding developments in IC processing and manufacturing are needed. As the dimensions of transistors decrease, the thickness of the gate oxide must be reduced to maintain performance with the decreased gate length. High dielectric constant (high-k) gate insulator layers may be used to reach larger physical thickness while keeping the same effective capacitance provided by other gate insulator layers, such as typical gate oxides.

As technology progresses, in some IC designs, there has been a desire to replace typical poly-silicon gate electrodes with metal gate (MG) electrodes so as to improve device performance. One process of forming the MG electrode is termed "gate last" process, as opposed to another MG electrode formation process termed "gate first." The "gate last" process allows for a reduced number of subsequent processes, including high temperature processing, that must be performed after the formation of gates.

Additionally, it is important to reduce the number of malfunctioning devices per manufactured wafer in order to improve yields.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
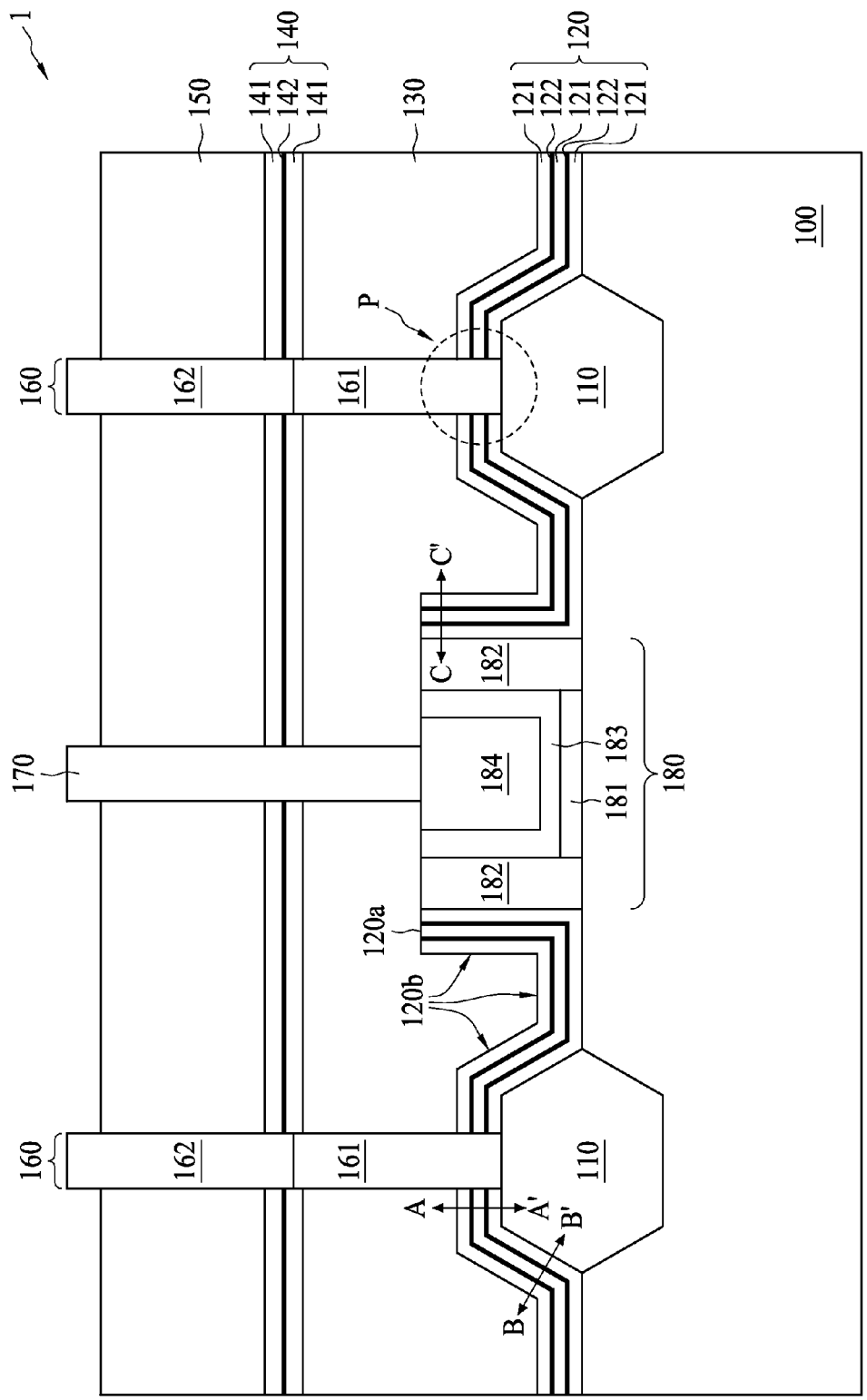
FIG. 1 is a schematic cross-sectional view of a semiconductor structure comprising a composite layer in accordance with some embodiments of the present disclosure.

In the following detailed description, numerous specific details are set forth in order to provide a thorough understanding of the present disclosure. However, it will be understood by those skilled in the art that the present disclosure may be practiced without these specific details. In other instances, well-known methods, procedures, components and circuits are not described in detail so as not to obscure the present disclosure.

Further, the present disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The making and using of the embodiments of the present disclosure are discussed in detail below. It should be appreciated, however, that the provided subject matter provides many applicable inventive concepts that may be embodied in a wide variety of specific contexts. The specific embodiments discussed herein are merely illustrative and do not limit the scope of the provided subject matter.

In the present disclosure, a composite film structure is disposed between at least two different conductive or semiconductive features in a semiconductor device. The composite film includes at least two types of layers. The first type is more resistant to etching than other features/regions of the semiconductor device (such as interlayer dielectric layers, source/drain/gate regions) and the semiconductor substrate, so as to protect those features and regions during etching. The first type may include, in some embodiments, nitrides. The second type has a higher bandgap than the first type such that electrons and/or other particles tunnel through the second type less easily than the first type. The second type may include, in some embodiments, oxides. Including these two types of layers, the composite film structure provides at least two functions (e.g., resisting undesired etching and blocking particles from tunneling through) at once. One or more of each of the two types of layers may be provided in the composite film structure, may be stacked and, in some embodiments, may be alternatingly stacked.

FIG. 1 illustrates the cross-sectional view of a semiconductor structure 1 in accordance with some embodiments of the present disclosure. The semiconductor structure 1 includes a substrate 100. The semiconductor structure 1 may include one or more source/drain regions 110. The semiconductor structure 1 may also include a gate region 180, which may include, among others, a gate dielectric layer 181, a spacer 182, an intermediate layer 183 and a metal layer 184. The semiconductor structure 1 may include other parts on or above the substrate 100, such as composite layers 120, 140 and interlayer dielectric (ILD) layers 130, 150. In some embodiments, the composite layer 120 may include one or more etch stop layers 121 and blocking layers 122. In some embodiments, the composite layer 140 may include one or more etch stop layers 141 and blocking layers 142. At least one plug 160 may be formed above the source/drain region 110. In some embodiments, the plug 160 may include a first portion 161 and a second portion 162. At least one plug 170 may also be formed above the gate region 180. In some embodiments, the plugs 160, 170 electrically connect the source/drain region 110 and the gate region 180 to circuit elements external to the semiconductor structure 1, such as metal interconnect layers.

The substrate 100 may be a semiconductor layer or a semiconductor substrate in accordance with some embodiments of the present disclosure. In some embodiments, the substrate 100 may include a crystalline silicon substrate (e.g., wafer. The substrate 100 may include various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or any suitable combinations thereof. The doped regions may be configured for an n-type FinFET or planar MOSFET, or alternatively configured for a p-type FinFET or planar MOSFET. Various other layers may be formed on the substrate 100, such as dielectric layers, doped layers, poly-silicon layers and/or conductive layers. Various devices may also be formed on the substrate 100, such as transistors, resistors, and/or capacitors. These devices may be interconnected through an interconnect layer to other circuit elements that may be part of one or more integrated circuits. Although not illustrated in FIG. 1, the interconnect layer may be formed above the semiconductor structure 1 and include metal. As such, the substrate 100, the composite layers 120, 140, the interlayer dielectric layers 130, 150 and other layers below the interconnect layer may be called pre-interconnect layers and/or pre-metal-interconnect layers.

The source/drain region 110 may include a silicon-containing material, such as SiGe, SiC, or SiP. In some embodiments, the source/drain region 110 may be formed by doping the semiconductor structure 1 with desired amounts of any suitable dopants. In some embodiments, the source/drain region 110 may be formed by epitaxy. Although a portion of the source/drain region 110 is above the surface of the substrate 100 as illustrated in FIG. 1, the source/drain region 110 may be below the surface of the substrate 100 in its entirety in accordance with some embodiments of the present disclosure. In some embodiments, the amount of doping in the source/drain region 110 may be uniform. In some embodiments, the amount of doping in the source/drain region 110 may be different in different parts of the source/drain region 110; for example, a portion of the source/drain region 110 may be a lightly doped source/drain (LDD) region. In some embodiments, the edge of the source/drain region 110 may be aligned with the edge of the spacer 182. In some embodiments, the edge of the source/drain region 110 may not be aligned with the edge of the spacer 182, as illustrated in FIG. 1. Similarly, the edge of the source/drain region 110 may or may not be aligned with the edge of the gate dielectric layer 181 in different embodiments of the present disclosure. A channel region may be formed between the source/drain regions 110 under the gate region 180 of the semiconductor structure 1.

The composite layer 120 may be formed above a portion of the substrate 100 and/or the source/drain regions 110, as illustrated in FIG. 1. The composite layer 120 may include at least two sub-layers and these two sub-layers are distinguishable between a measurable physical or chemical property. In some embodiments, these two sub-layers are differentiated by their energy bandgap (sometimes referred to as simply "bandgap"). In some embodiments, these two sub-layers are differentiated by etch selectivity. For example, one of the two sub-layers has a larger bandgap than the other in order to block electron penetration more effectively. For reader's reference, the sub-layer possessing a larger (or largest) bandgap is called "blocking layer" throughout this disclosure. Similarly, if one sub-layer possesses a higher etch resistance to a predetermined etchant than other sub-layers, it is called "etch stop layer" in the present disclosure.

In FIG. 1, the composite layer 120 includes at least one etch stop layers 121 and one blocking layers 122. As illustrated in FIG. 1, the etch stop layers 121 and the blocking layers 122 are stacked. The stacking direction can be arranged in various ways.

In some embodiments, the etch stop layers 121 and the blocking layers 122 are stacking up along the longitudinal direction of the plug 160 or 170 (e.g., AA' in FIG. 1); they may also be stacking up along different directions. In some embodiments, the composite layer 120 is conformal to underneath regions/features, such as the raised source/drain region 110, in which case the etch stop layers 121 and the blocking layers 122 stack up (as illustrated in FIG. 1) along the normal of the edges of the source/drain region 110 not in parallel to the top surface of the substrate 100 (e.g., BB' in FIG. 1). In some embodiments, the composite layer 120 is conformal to regions/features on the left or right, such as the spacer 182 of the gate region 180, in which case the etch stop layers 121 and the blocking layers 122 are stacked from left to right, or perpendicular to the longitudinal direction of the plug 160 or 170 (e.g., CC' in FIG. 1).

In some embodiments, the composite layer 120 may include one etch stop layer 121 and one blocking layer 122. In some embodiments, the composite layer 120 may include one blocking layer 122 sandwiched between two etch stop layers 121, or vice versa. In some embodiments, the etch stop layers 121 and the blocking layers 122 are arranged in an interlaced pattern. For example, as in FIG. 1, arrangement of films in the composite layer 120 is in a sequence of 121, 122, 121, 122, and 121 from the substrate 100 toward the ILD 130.

Other numbers of layers for the etch stop layers 121 and the blocking layers 122 are also possible. The composite layer 120, the etch stop layer 121 and the blocking layer 122 may be formed by any suitable process, such as film deposition, chemical vapor deposition (CVD), physical vapor deposition (PVD) and atomic layer deposition (ALD).

Before, during and/or after the manufacturing process of the semiconductor structure 1, an etchant may be used to help remove some parts/materials. For example, an etchant may be used to remove part of the interlayer dielectric layer 130 to help form the first portion 161 of the plug 160. In some embodiments, the etchant may be an oxide etchant. In some embodiments, the etchant may include a wet etchant or a dry etchant. In some embodiments, the etchant may include a wet etchant including hydrofluoric acid (HF). Other suitable etchants may also be used.

It would be undesirable if an etchant etches substantially more than what it should etch. For example, if an etchant is used to etch the interlayer dielectric layer 130, it should not substantially etch the substrate 100 and/or the source/drain region 110. The etch stop layer 121 may be formed above a portion of the substrate 100 and/or source/drain region 110 so as to prevent such undesirable etching. In accordance with some embodiments of the present disclosure, the etch rate of an etchant (such as a wet etchant) with respect to the etch stop layer 121 is lower than the etch rate of said etchant with respect to the substrate 100 and/or the interlayer dielectric layer 130. In some embodiments, the etch rate of an etchant with respect to the etch stop layer 121 is lower than the etch rate of said etchant with respect to the blocking layer 122. In some embodiments, the etch stop layer 121 may include nitrides, such as silicon nitride (SiN) and/or silicon carbon nitride (SiCN). The etch stop layer 121 may include other suitable materials. The thickness of the etch stop layer 121 may be between about 2 and about 2000 Å. The bandgap of the etch stop layer 121 may be between about 0.1 and about 20 eV.

As described previously, the etch stop layers 121 may be stacked along different directions, such as along the plug 160 (AA'), along the normal of the non-flat edges of the source/drain region 110 (BB') and from right to left (CC'). Thus, the etch stop layer 121 may prevent undesirable etching along not only the vertical direction but also non-vertical directions.

Still referring to FIG. 1, one or more blocking layers 122 may be formed in the composite layer 120. The bandgap of the blocking layer 122 may be between about 0.1 and about 20 eV. In accordance with some embodiments of the present disclosure, the bandgap of the blocking layer 122 is higher than the bandgap of the etch stop layer 121. Consequently, electrons or other particles would be less likely to tunnel through the combination of the etch stop layer 121 and the blocking layer 122 than through the etch stop layer 121 alone via the (quantum) tunneling effect. In some embodiments, the blocking layer 122 may include oxides, such as silicon oxides ($SiO_x$). The blocking layer 122 may include other suitable materials. In some embodiments, the ratio of the bandgap of the blocking layer 122 to the bandgap of the etch stop layer 121 is between 1 and about 200. The thickness of the blocking layer 122 may be between about 2 and about 2000 Å. In some embodiments, the ratio of the thickness of the etch stop layer 121 to the thickness of the blocking layer 122 is between about 0.001 and about 1000. As described previously, the blocking layers 122 may be stacked along different directions, such as along the plug 160 (AA'), along the normal of the non-flat edges of the source/drain region 110 (BB') and from right to left (CC'). Thus, the blocking layers 122 may reduce electron tunneling between regions/features paired in various different directions.

For example, the blocking layers 122 may prevent electrons from undesirably tunneling through the composite layer 120 from the portion 161 of the plug 160 to the gate region 180. Less undesirable tunneling may have the beneficial effects of, e.g., increased breakdown voltage of manufactured devices and better yields.

Although electrical communication between the source/drain region 110 and the gate region 180 through the channel region (not shown in FIG. 1) formed under the gate region 180 may exist, sometimes it is undesirable to have additional electrical communication paths, such as a tunneling path via the conformal part 120b of the composite layer 120 between the source/drain region 110 and gate region 180. In this case, the blocking layers 122 may prevent this undesirable additional electrical communication path by making it harder for electrons to tunnel through the composite layer 120 from the source/drain region 110 and the gate region 180 (and vice versa).

The etch stop layer 121 and blocking layer 122 may be differentiated by etch selectivity, in addition to energy bandgap. In some embodiments, the ratio of the etch rate of an etchant with respect to the etch stop layer 121 to the etch rate of said etchant with respect to the blocking layer 122 may be less than about 0.3, between about 0.3 and about 0.5, between about 0.5 and about 0.7, between about 0.7 and about 0.85, between about 0.85 and about 0.9, between about 0.9 and about 0.95, or more than about 0.95.

Referring to FIG. 1, the interlayer dielectric layer 130 may be above a portion of the composite layer 120 and/or the gate region 180. In some embodiments, a portion of the interlayer dielectric layer 130 is in contact with the composite layer 120, the spacer 182, the intermediate layer 183 and/or the metal layer 184. The interlayer dielectric layer 130 is dielectric, which include a dielectric material. The dielectric material may include silicon oxide, silicon nitride, silicon oxynitride, spin-on glass (SOG), fluorinated silica glass (FSG), carbon doped silicon oxide (e.g., SiCOH), BLACK DIAMOND® (Applied Materials of Santa Clara, Calif.), XEROGEL®, AEROGEL®, amorphous fluorinated carbon, Parylene, BCB (bis-benzocyclobutenes), FLARE®, SILK® (Dow Chemical, Midland, Mich.), polyimide, other proper porous polymeric materials, other suitable dielectric materials, and/or combinations thereof. In some embodiments, the interlayer dielectric layer 130 may include a high density plasma (HDP) dielectric material (e.g., HDP oxide) and/or a high aspect ratio process (HARP) dielectric material (e.g., HARP oxide). The interlayer dielectric layer 130 may include any suitable thickness. In some embodiments, the interlayer dielectric layer 130 may include a thickness of about 1 Å to 2000 Å. The interlayer dielectric layer 130 may include one or more dielectric materials and/or one or more dielectric layers. In some embodiments, the ratio of the etch rate of an etchant with respect to the etch stop layer 121 to the etch rate of said etchant with respect to the interlayer dielectric layer 130 may be less than about 0.3, between about 0.3 and about 0.5, between about 0.5 and about 0.7, between about 0.7 and about 0.85, between about 0.85 and about 0.9, between about 0.9 and about 0.95, or more than about 0.95.

Referring to FIG. 1, a composite layer 140 may be formed above a portion of the interlayer dielectric layer 130. The composite layer 140 may include one or more etch stop layers 141 and one or more blocking layers 142. As illustrated in FIG. 1, the etch stop layers 141 and the blocking layers 142 may be interposed. In some embodiments, the composite layer 140 may include one etch stop layer 141 and one blocking layer 142. In some embodiments, the composite layer 140 may include one blocking layer 142 sandwiched between two etch stop layers 141, or vice versa.

Other numbers of layers for the etch stop layers 141 and the blocking layers 142 are also possible. The composite layer 140, the etch stop layer 141 and the blocking layer 142 may be formed by any suitable process, such as film deposition, CVD, PVD and ALD.

As with the composite layer 120, the composite layer 140 may include at least one etch stop layers 141 and at least one blocking layers 142. The choice of possible materials, ranges of thickness and bandgap of the etch stop layer 141 may be substantially similar to those of the etch stop layer 121 as described in other parts of present disclosure. In addition, the choice of possible materials, ranges of thickness and bandgap of the blocking layer 142 may be substantially similar to those of the blocking layer 122 as previously described in the present disclosure. The relative etch rate (e.g., etch selectivity) between the etch stop layer 141 and the blocking layer 142 with respect to an etchant may also be similar to that between the etch stop layer 121 and the blocking layer 122 as described herein. The etch stop layers 141 and blocking layers 142 may be stacked in a manner similar to the etch stop layers 121 and blocking layers 122. Thus, although FIG. 1 illustrates only that the etch stop layers 141 and blocking layers 142 are stacked along the vertical direction, they may also be stacked along different directions if the regions/features underneath the conformal composite layer 140 are not completely flat. The composite layer 140 may include different numbers of the etch stop layers 141 and blocking layers 142 from the numbers of the etch stop layers 121 and blocking layers 122 included in the composite layer 120. The stacking patterns may also be different, e.g., "121 122 121 122 121" vs. "141 142 141." Non-strictly-alternating patterns such as "142 142 141 142" may also be possible.

The blocking layers 142, as illustrated in FIG. 1, exist between the conductive plugs 160 and 170. Thus, the blocking layer 142 may reduce electrons from undesirably tunneling the composite layer 140 between the conductive plugs 160 and 170. The blocking layers 142 (along with the blocking layers 122) may also help reduce electrons tunneling from the plug 170 to the source/drain region 110 through the composite layer 140, the thinner part of the interlayer dielectric layer 130 above the portion 120a of the composite layer 120, and the conformal part 120b of the composite layer 120.

Referring to FIG. 1, an interlayer dielectric layer 150 may be formed above the composite layer 140, in accordance with some embodiments of the present disclosure. The choice of materials, the ranges of thickness and the electrical conductivity of the interlayer dielectric layer 150 may be substantially similar to those of the interlayer dielectric layer 130 as previously described in the present disclosure and thus are not repeated. The interlayer dielectric layer 150 may include one or more dielectric materials and/or one or more dielectric layers. The relative etch rate (e.g., etch selectivity) between the etch stop layer 141 and the interlayer dielectric layer 150 with respect to an etchant may also be similar to that between the etch stop layer 121 and the interlayer dielectric layer 130 as described herein.

At least one plug 160 may exist in the semiconductor structure 1 so as to electrically connect the source/drain region 110 to circuit elements external to the semiconductor structure 1. In some embodiments, said circuit elements could be interconnect layers and/or metal-interconnect layers. As illustrated in FIG. 1, the tip of the plug 160 is exposed from the semiconductor structure 1. In some embodiments, the tip of the plug 160 may be substantially coplanar with the top surface of the interlayer dielectric layer 150. In some embodiments, the plug 160 may include a first portion 161 and a second portion 162. In some embodiments, the second portion 162 may be formed after or concurrently with the first portion 161. In some embodiments, the plug 160 may be in contact with a portion of the composite layers 120, 140 and/or the interlayer dielectric layers 130, 150. The plug 160 may include suitable materials, such as metals (including but not limited to copper and tungsten), metal compounds, metal alloys and/or other electrically conductive materials. In some embodiments, any of the first portion 161 and the second portion 162 may include one or more materials and/or one or more layers. The plug 160 may be formed by any suitable processes, including but not limited to CVD, PVD and ALD.

Figure 2:
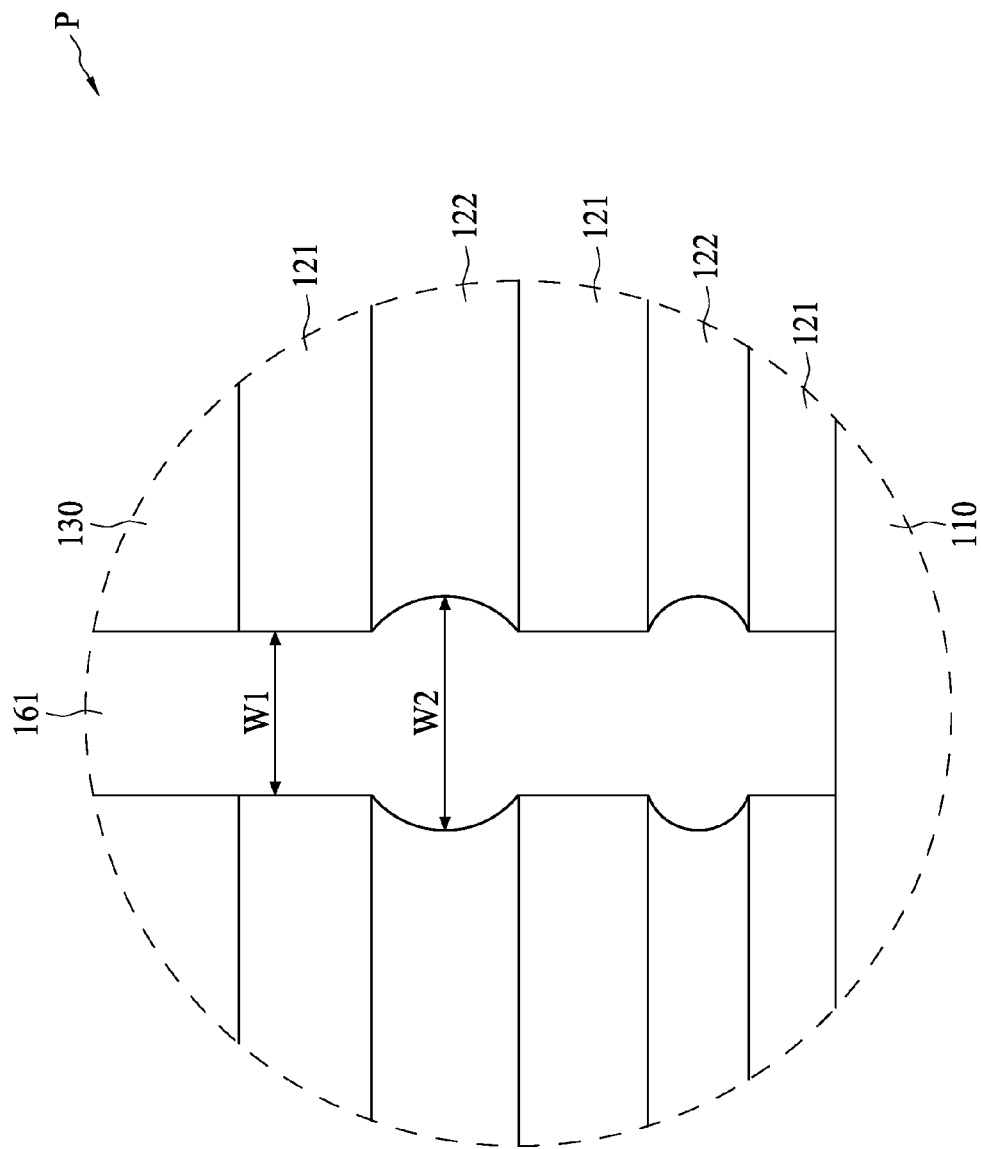
FIG. 2 is an enlarged schematic cross-sectional view of a part of the semiconductor structure illustrated in FIG. 1 in accordance with some embodiments of the present disclosure.

FIG. 2 illustrates an enlarged view of area P of FIG. 1 and provides more details on the possible shape of the portion of the first portion 161 of the plug 160 surrounded by the composite layer 120. It is to be noted that the number of layers and the thickness of the etch stop layer 121 and the blocking layer 122 as illustrated in FIG. 2 are merely exemplary and not limiting. The portion(s) of the portion 161 that is substantially coplanar with the etch stop layer 121 has a first width $W_1$. The portion(s) of the portion 161 that is substantially coplanar with the blocking layer 122 has a second width $W_2$. In accordance with some embodiments of the present disclosure, $W_1$ is less than $W_2$. In some embodiments, the ratio of $W_1$ to $W_2$ may be less than about 0.3, between about 0.3 and about 0.5, between about 0.5 and about 0.7, between about 0.7 and about 0.85, between about 0.85 and about 0.9, between about 0.9 and about 0.95, or more than about 0.95.

Referring back to FIG. 1, at least one plug 170 may exist in the semiconductor structure 1 so as to electrically connect the gate region 180 to circuit elements external to the semiconductor structure 1. In some embodiments, said circuit elements could be interconnect layers and/or metal-interconnect layers. As illustrated in FIG. 1, the tip of the plug 170 is exposed from the semiconductor structure 1. In some embodiments, the tip of the plug 170 may be substantially coplanar with the top surface of the interlayer dielectric layer 150. Although the plug 170 is illustrated as one integral part in FIG. 1, it is understood that the plug 170 may include one or more layers or portions. In some embodiments, the plug 170 may be in contact with a portion of the composite layer 140 and/or the interlayer dielectric layers 130, 150. The plug 170 may include suitable materials, such as metals (including but not limited to copper and tungsten), metal compounds, metal alloys and/or other electrically conductive materials. The plug 170 may be formed by any suitable processes, including but not limited to CVD, PVD and ALD.

The plug 170 may or may not be electrically connected to the plugs 160 by the circuit elements external to the semiconductor structure 1. In case where they are not, it would be undesirable to have electrical communication paths between the plugs 160 and 170 inside the semiconductor structure 1. The blocking layers 122, 142 may reduce this undesirable electrical communication within the semiconductor structure 1 by reducing the numbers of electrons that could tunnel from the plug 160 to the plug 170 (or the other way round) through the composite layer 140. Reducing undesirable electrical communication between the plugs 160 and 170 may help improve manufacturing yield.

Referring to FIG. 1, the gate region 180 is formed above the surface of the substrate 100. In some embodiments, at least a part of the gate region 180 may be formed below the surface of the substrate 100. The gate region 180 may include, among others, a gate dielectric layer 181, a spacer 182, an intermediate layer 183 and a metal layer 184.

Although the gate dielectric layer 181 is illustrated in FIG. 1, the gate dielectric layer 181 may be optional in accordance with some embodiments of the present disclosure. In some embodiments, the gate dielectric layer 181 may include silicon oxide, silicon oxynitride, a high-k dielectric layer and/or combinations thereof. The gate dielectric layer 181 may further include an interfacial layer to reduce damages between the gate dielectric layer 141 and the semiconductor layer 10. The interfacial layer may include silicon oxide. The gate dielectric layer 181 may be formed by any suitable process, such as chemical vapor deposition (CVD), physical vapor deposition (PVD) and atomic layer deposition (ALD).

The gate region 180 may additionally include one or more spacers 182. In some embodiments, the spacers 182 may surround at least a portion of the gate dielectric layer 181. The spacers 182 may be formed using any suitable process to any suitable thickness, including the processes described herein. The spacers 182 may include a dielectric material such as silicon nitride, silicon oxide, silicon carbide, silicon oxynitride, other suitable materials, and/or combinations thereof. In some embodiments, the spacers 182 may include a multilayer structure. The spacers 182 may help define the location of the gate region 180 in the semiconductor structure 1. In some embodiments of the present disclosure, the top surface of the spacer 182 may be substantially coplanar with a portion 120a of the top surface of the composite layer 120. In some embodiments, the top surface of the spacer 182 may be in contact with a portion of the interlayer dielectric layer 130.

Still referring to FIG. 1, an intermediate layer 183 may be formed above the substrate 100 and/or the gate dielectric layer 181. In some embodiments, the intermediate layer 183 may be in contact with the gate dielectric layer 181 and/or the spacers 182. In some embodiments, the top surface of the intermediate layer 183 may be substantially coplanar with the spacer 182 and/or a portion 120a of the top surface of the composite layer 120. In some embodiments, the top surface of the intermediate layer 183 may be in contact with a portion of the interlayer dielectric layer 130. In some embodiments of the present disclosure, the intermediate layer 183 may include one or more materials and/or one or more layers. For example, the intermediate layer 183 may include a dielectric layer, a high-K dielectric layer, a barrier layer, and/or a work function layer. The dielectric layer may include silicon oxide, silicon nitride, silicon oxynitride, polyimide, other suitable dielectric materials, and/or combinations thereof. The high-k dielectric layer may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, silicon nitride, silicon oxynitride, zirconium oxide, titanium oxide, aluminum oxide, hafnium dioxide-alumina ($HfO_2$—$Al_2O_3$) alloy, other suitable high-k dielectric materials, and/or combinations thereof. In some embodiments, the barrier layer may include TiN, TiCN, TaN, TaCN, WN and/or WCN. In some embodiments, the work function layer may include metal carbonitride, metal silicon nitride, metal aluminide, TiSiN, TiAlN, TiAl, TaAl, other suitable materials, and/or combinations thereof. The dielectric layer, the high-K dielectric layer, the barrier layer, and/or the work function layer may be formed by suitable processes, including at least ALD, PVD, CVD and plasma-enhanced chemical vapor deposition (PECVD).

Still referring to FIG. 1, a metal layer 184 may be above a portion of the intermediate layer 183. In some embodiments of the present disclosure, at least a portion of the metal layer 184 is surrounded by the intermediate layer 183. The metal layer 184 may include single metals, such as Al, W, WN, TaN, and Ru; metal compounds, such as TaN, TiN, W, WN, and WCN; other suitable materials; and/or combinations thereof. In some embodiments, the metal layer 184 may include one or more layers. The metal layer 184 may be formed by any suitable processes, including but not limited to CVD and PVD.

Figure 3A:
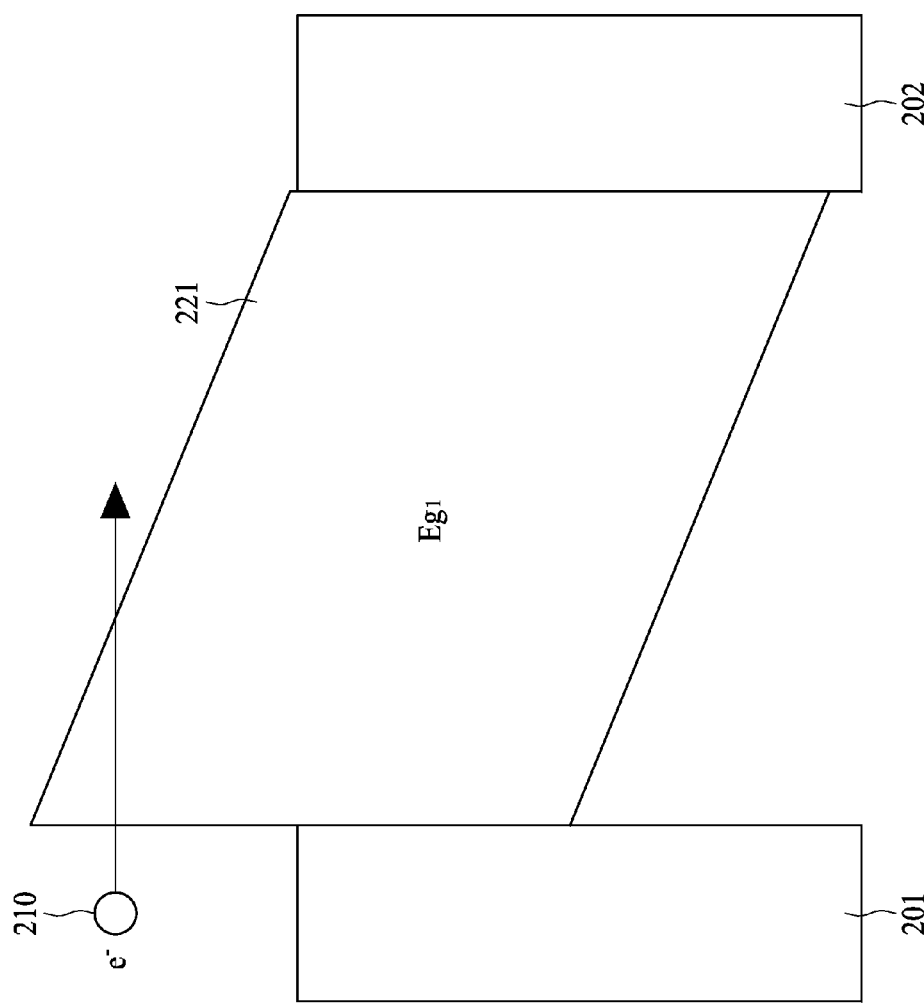
FIG. 3A is a schematic diagram that illustrates the tunneling phenomenon between two regions of the semiconductor structure in accordance with some embodiments of the present disclosure.
Figure 3B:
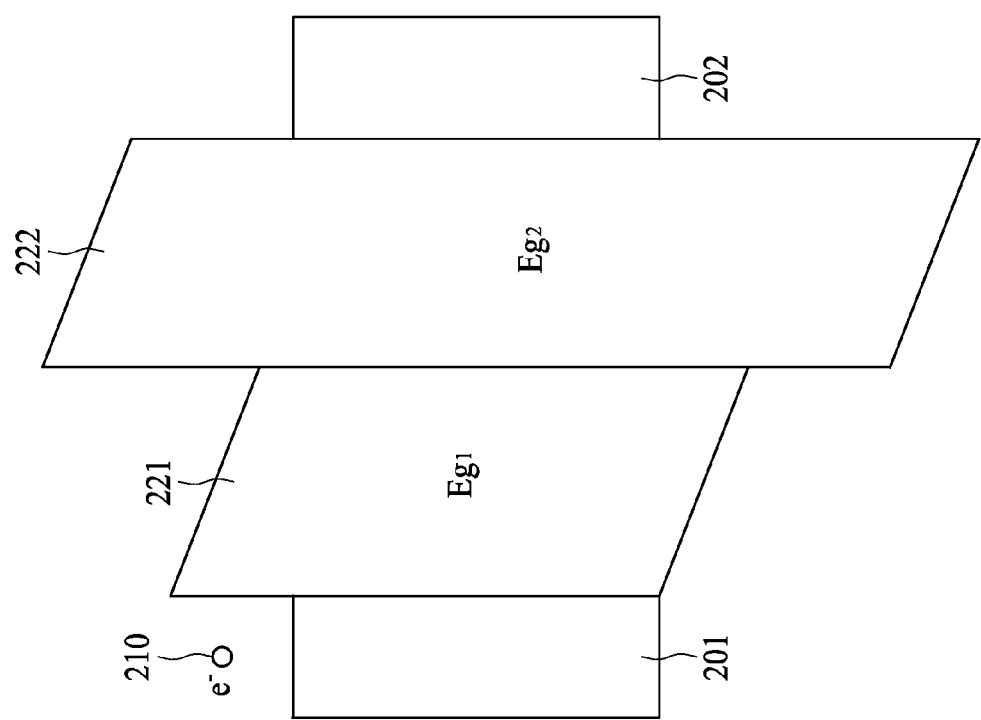
FIG. 3B illustrates the situation with two different layers and/or materials between two regions of the semiconductor structure in accordance with some embodiments of the present disclosure.
Figure 3C:
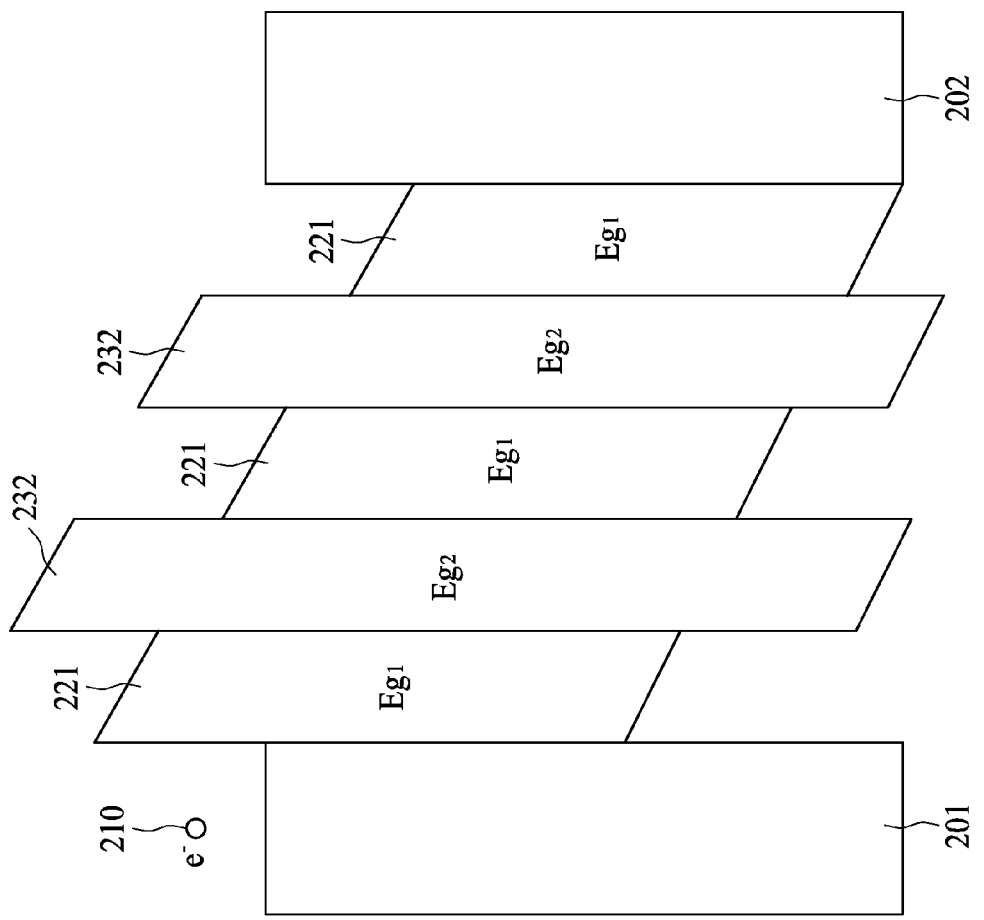
FIG. 3C illustrates the situation with more than two interposed layers and/or materials between two regions of the semiconductor structure in accordance with some embodiments of the present disclosure.

FIGS. 3A-3C are schematic diagrams that illustrate the tunneling phenomenon between two regions of the semiconductor structure in accordance with some embodiments of the present disclosure.

Referring to FIG. 3A, the first region 201 and the second region 202 may be semiconductive, conductive, or non-electrically-insulating. The first material 221 has a bandgap of $E_{g1}$ and is between the first region 201 and the second region 202. One or more electrons 210 originating from the first region 201 may cross the barrier of the first material 221 (with the bandgap of $E_{g1}$) and reach the second region 202 via the tunneling effect or the quantum tunneling effect. If enough electrons tunnel through the first material 221, then there would exist a non-negligible current between the first region 201 and the second region 202.

Referring to FIG. 3B, two materials 221, 222 exist between the first region 201 and the second region 202. The first material 221 has a bandgap of $E_{g1}$; the second material 222, $E_{g2}$. $E_{g2}$ is greater than $E_{g1}$. Since the barrier between the first and second regions 201, 202 in FIG. 3B is higher than in FIG. 3A, less electrons would leave the first region 201 and reach the second region 202 via the tunneling effect in FIG. 3B than in FIG. 3A. In other words, a higher bandgap reduces the number of electrons tunneling from the first region 201 and the second region 202.

In accordance with some embodiments of the present disclosure, the two materials 221, 222 may be in the form of interposed layers, as illustrated in FIG. 3C. Since there are more layers with the higher bandgap of $E_{g2}$, less electrons would tunnel through the stack of materials 221, 222.

Referring back to FIG. 1. The source/drain region 110, the gate region 180, the portions 161, 162 of the plug 160 and/or the plug 170 may be non-electrically-insulating such as semiconductive or conductive. Thus, electron tunneling might occur between two of these regions/features, e.g., between the source/drain region 110 and the gate region 180 and/or between the plug 160 and the plug 170. In other words, electrons might tunnel through the composite layers 120, 140. Since the composite layer 120 includes the blocking layer 122, which has a higher bandgap than the etch stop layer 121, electrons would be less likely to tunnel through the composite layer 120 than if the composite layer 120 included only the etch stop layer 121 and did not include the blocking layer 122. In other words, the tunneling-induced current between any pair of the two regions/features chosen from at least the source/drain region 110, the gate region 180, the portions 161, 162 of the plug 160 and/or the plug 170 would be reduced, resulting in higher device yields and thus lower manufacturing cost.

In accordance with one embodiment of the present disclosure, a semiconductor structure comprises a substrate, a pre-metal-interconnect dielectric (PMID) layer and a composite layer. The PMID layer is above the substrate. The composite layer is between the substrate and the PMID layer. The composite layer comprises a first sublayer and a second sublayer. The first sublayer and the second sublayer are stacked. The bandgap of the second sublayer is larger than the bandgap of the first sublayer. The etch rate of an etchant with respect to the first sublayer is lower than the etch rate of the etchant with respect to the substrate and the PMID layer.

In accordance with another embodiment of the present disclosure, a semiconductor structure comprises a first region, a second region and a third region. The first region is semiconductive or conductive, and the second region is semiconductive or conductive. The third region comprises a first material and a second material. The etch rate of an etchant with respect to the first material is lower than the etch rate of the etchant with respect to the second material. The bandgap of the second material is larger than the bandgap of the first material. Each of the first region and the second region is in contact with the third region. The first region is substantially separated from the second region.

In accordance with another embodiment of the present disclosure, a semiconductor structure comprises a first non-electrically-insulating region, a second non-electrically-insulating region, a first layer, a second layer and a composite layer. At least one of the first layer and the second layer is between the first non-electrically-insulating region and the second non-electrically-insulating region. The composite layer is between the first layer and the second layer. The composite layer comprises an etch stop layer and a film. The bandgap of the film is higher than the bandgap of the etch stop layer. The composite layer is in contact with the first non-electrically-insulating region and the second non-electrically-insulating region. The etch rate of an etchant with respect to the etch stop layer is lower than the etch rate of the etchant with respect to the first layer and the second layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate,
a source/drain region over the substrate,
a gate region over the substrate,
a pre-metal-interconnect dielectric (PMID) layer above said substrate, wherein said PMID layer is a single-layered dielectric disposed over and surrounding said gate region,
a composite layer between said substrate and said PMID layer, said composite layer comprising:
a first sublayer comprising a first material, and a second sublayer comprising a second material,
wherein said first sublayer and said second sublayer are stacked, said first sublayer is between and in contact with the substrate and said second sublayer,
said second sublayer is conformally in contact with said first sublayer; said second sublayer is not in contact with the substrate and the source/drain region, and
a bandgap of said second material is larger than a bandgap of said first material.

2. The semiconductor structure according to claim 1, wherein:
an etch rate with respect to said first material is lower than an etch rate with respect to said second material.

3. The semiconductor structure according to claim 2, wherein:
said second material comprises oxides.

4. The semiconductor structure according to claim 1, wherein:
said composite layer further comprises a third sublayer made of the first material, and said second sublayer is between said first sublayer and said third sublayer.

5. The semiconductor structure according to claim 1, wherein:
the bandgap of said second material is between about 0.1 eV and about 20 eV.

6. The semiconductor structure according to claim 1, wherein:
the ratio of the bandgap of said second material to the bandgap of said first material is between about 1 and about 200.

7. The semiconductor structure according to claim 1, wherein:
a thickness of said first material is between about 2 Å and about 2000 Å.

8. The semiconductor structure according to claim 1, wherein:
a ratio of a thickness of said first material to a thickness of said second material is between about 0.001 and about 1000.

9. The semiconductor structure according to claim 1, wherein:
a thickness of said second material is between about 2 Å and about 2000 Å.

10. The semiconductor structure according to claim 1, wherein:
a portion of said composite layer is conformal with respect to an underneath layer.

11. The semiconductor structure according to claim 1, wherein:
said composite layer comprises a few sublayers of said first material and a few sublayers of said second material that are stacked in an alternating pattern.

12. A semiconductor structure, comprising:
a substrate;
a gate region over the substrate, wherein the gate region includes an edge and an upper surface;
a first dielectric layer over the substrate and the gate region, wherein the first dielectric layer is a single-layered dielectric disposed over and surrounding the gate region;
a second dielectric layer over the first dielectric layer;
a first composite layer and a second composite layer over the substrate, wherein each of the first composite layer and the second composite layer comprises:
a first sublayer comprising a first material; and
a second sublayer comprising a second material stacked on the first sublayer, wherein a bandgap of the second material is larger than a bandgap of the first material, the first composite layer is between the substrate and the first dielectric layer, covers the edge of the gate region and exposing the upper surface of the gate region, and the second composite layer is between the first dielectric layer and the second dielectric layer; and a plug through the second dielectric layer, the second composite layer and the first dielectric layer, and electrically connected to the gate region.

13. The semiconductor structure according to claim 12, wherein the bandgap of the second material is between about 0.1 eV and about 20 eV.

14. The semiconductor structure according to claim 12, wherein a ratio of a thickness of the first material to a thickness of the second material is between about 0.001 and about 1000.

15. The semiconductor structure according to claim 12, wherein the first material comprises nitrides, and the second material comprises oxides.

16. A semiconductor structure, comprising:
a substrate;
a source/drain region over the substrate;
a gate region over the substrate;
a first dielectric layer over the substrate and the source/drain region, wherein the first dielectric layer is a single-layered dielectric disposed over and surrounding the gate region;
a second dielectric layer over the first dielectric layer;
a first composite layer and a second composite layer over the substrate, wherein each of the first composite layer and the second composite layer comprises: a first sublayer comprising a first material; and
a second sublayer comprising a second material stacked on the first sublayer, wherein a bandgap of the second material is larger than a bandgap of the first material,
the first composite layer is between the substrate and the first dielectric layer, and covers the source/drain region,
the second sublayer of the first composite layer is conformally in contact with the first sublayer of the first composite layer, the second sublayer of the first composite layer is not in contact with the substrate and the source/drain region, and
the second composite layer is between the first dielectric layer and the second dielectric layer; and
a plug through the second dielectric layer, the second composite layer, the first dielectric layer and the first composite layer, and electrically connected to the source/drain region.

17. The semiconductor structure according to claim 16, wherein the bandgap of the second material is between about 0.1 eV and about 20 eV.

18. The semiconductor structure according to claim 16, wherein a ratio of a thickness of the first material to a thickness of the second material is between about 0.001 and about 1000.

19. The semiconductor structure according to claim 16, wherein the first material comprises nitrides, and the second material comprises oxides.

20. The semiconductor structure according to claim 16, wherein a ratio of the bandgap of the second material to the bandgap of the first material is between about 1 and about 200.

* * * * *